(12) United States Patent
Kao

(10) Patent No.: US 7,498,190 B2
(45) Date of Patent: Mar. 3, 2009

(54) METHOD FOR FABRICATING A CMOS IMAGE SENSOR

(75) Inventor: Ching-Hung Kao, Hsin-Chu Hsien (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 11/681,144

(22) Filed: Mar. 1, 2007

(65) Prior Publication Data

US 2008/0213938 A1 Sep. 4, 2008

(51) Int. Cl.
*H01L 21/00* (2006.01)
(52) U.S. Cl. .............................. 438/98; 438/57; 438/70; 438/200; 257/E33.062
(58) Field of Classification Search .................. 438/57, 438/70, 200, 734, 720, 98; 257/E33.062
See application file for complete search history.

(56) References Cited

U.S. PATENT DOCUMENTS 5,665,646 A * 9/1997 Kitano ........................ 438/592

| | | | |
|---|---|---|---|
| 2006/0046341 A1* | 3/2006 | Joon | 438/70 |
| 2006/0086957 A1* | 4/2006 | Kang | 257/292 |
| 2006/0228897 A1* | 10/2006 | Timans | 438/758 |
| 2007/0148806 A1* | 6/2007 | Kim | 438/59 |

OTHER PUBLICATIONS

Wolf et al., Silicon Processing for the VLSI Era, vol. 1: Process Technology, 1986 by Lattice Press, pp. 532-534.*

* cited by examiner

*Primary Examiner*—George Fourson
*Assistant Examiner*—Julio J. Maldonado
(74) *Attorney, Agent, or Firm*—Winston Hsu

(57) ABSTRACT

A method for fabricating a CMOS image sensor is disclosed. First, a substrate having a sensor array region and a peripheral region is provided. A contact pad is formed on the substrate of the peripheral region, and a dielectric layer is disposed on the substrate for exposing the surface of the contact pad. A cap layer is disposed on the dielectric layer and the contact pad, in which the cap layer is patterned to form an optical shielding layer on the dielectric layer of the peripheral region and a passivation layer on the contact pad. Subsequently, a plurality of color filters, a planarizing layer, and a plurality of microlenses are disposed on the dielectric layer.

20 Claims, 10 Drawing Sheets

METHOD FOR FABRICATING A CMOS IMAGE SENSOR

BACKGROUND OF THE INVENTION

1. Field of the Invention

The invention relates to a method for fabricating a CMOS image sensor.

2. Description of the Prior Art

As the development of electronic products progresses, the demand for related components has increased as well. For example, as the development of digital cameras and scanners progresses, the demand for image sensor increases accordingly. In general, today's image sensors in common usage are divided into two main categories: charge coupled device (CCD) sensors and CMO image sensors (CIS). The application of CMOS image sensors has increased significantly for several reasons. Primarily, CMOS image sensors have certain advantages of offering low operating voltage, low power consumption, and the ability for random access. Additionally, CMOS image sensors are currently capable of integration with the semiconductor fabrication process.

The CMOS image sensor separates (i.e., classifies) incident light into a combination of light of different wavelengths. The light of different wavelengths is received by respective sensing elements and is subsequently transferred into digital signals of different intensities. For example, the CMOS image sensor can consider incident light as a combination of red, blue, and green light. Those wavelengths are subsequently received by photodiodes, and then transformed into digital signals. However, in order to separate incident light, a monochromatic color filter array (CFA) must be set above every optical sensor element.

Please refer to FIGS. 1-4. FIGS. 1-4 illustrate a method for fabricating a CMOS image sensor according to the prior art. As shown in FIG. 1, a semiconductor substrate 12 having a sensor array region 14 and a peripheral region 16 is provided. A plurality of photodiodes 18, CMOS transistors (not shown), and shallow trench isolations 20 surrounding the photodiodes 18 are formed on the semiconductor substrate 12, and a dielectric layer 22 is deposited on the semiconductor substrate 12 thereafter. Next, a plurality of patterned metal layers 24 is disposed on the dielectric layer 22 of the sensor array region 14 for forming metal interconnects of the CMOS image sensor and a patterned metal layer is disposed on the dielectric layer 22 of the peripheral region 16 for serving as a contact pad 26. Another dielectric layer 28 is disposed on the dielectric layer 22 covering the metal layer 24 and the contact pad 26 thereafter. Next, a patterned photoresist (not shown) is disposed on the dielectric layer 28 and an etching process is performed by using the patterned photoresist as a mask to remove a portion of the dielectric layer 28 for forming an opening 30 in the dielectric layer 28 and exposing the surface of the contact pad 26.

As shown in FIG. 2, a cap layer 32 is disposed on the dielectric layer 28 and the contact pad 26, in which the cap layer 32 is composed of titanium or titanium nitride. As shown in FIG. 3, a patterned photoresist (not shown) is disposed on the cap layer 32 and an etching process is performed by using the patterned photoresist as a mask to remove a portion of the cap layer 32 for forming an optical shielding layer 34 on the dielectric layer 28 of the peripheral region 16 adjacent to the sensor array region 14. The optical shielding layer 34 preferably serves to block external lights projecting from the peripheral region 16 to the sensor array region 14.

As shown in FIG. 4, a plurality of color filtering layers (not shown) is disposed on the dielectric layer 28 of the sensor array region 14, and a series of exposure and development processes are conducted to form a plurality of color filters 36 corresponding to each of the photodiodes 18 disposed in the semiconductor substrate 12. The color filters 36 are composed of red color filters, green color filters, blue color filters or filters of other colors. Thereafter, a planarizing layer 38 is formed on the color filters 36 and the optical shielding layer 34, and a polymer layer (not shown) composed acrylate material is disposed on the planarizing layer 38. Next, a series of exposure, development, and baking process are performed to form a plurality of microlenses 40 corresponding to the color filters 36, thus complete the fabrication of a CMOS image sensor 42.

It should be noted that the a series of exposure and development processes are usually conducted to fabricating optical devices including color filters, planarizing layer, and microlenses. Since the contact pad disposed on the peripheral region of the CMOS image sensor is typically composed of aluminum, and the surface of the contact pad is exposed during the fabrication process, the developer used for the development process will often corrode the exposed contact pad and result in a pitting phenomenon. This phenomenon not only produces a plurality of recess on the surface of the pad, but also influences the reliability of the pad for conducting wire bonding in the later process.

SUMMARY OF THE INVENTION

It is an objective of the present invention to provide a method for fabricating a CMOS image sensor for solving the aforementioned problems.

A method for fabricating a CMOS image sensor is disclosed. First, a substrate having a sensor array region and a peripheral region is provided. A contact pad is formed on the substrate of the peripheral region, and a dielectric layer is disposed on the substrate for exposing the surface of the contact pad. A cap layer is disposed on the dielectric layer and the contact pad, in which the cap layer is patterned to form an optical shielding layer on the dielectric layer of the peripheral region and a passivation layer on the contact pad. Subsequently, a plurality of color filters, a planarizing layer, and a plurality of microlenses are disposed on the dielectric layer.

The present invention uses a patterned cap layer to fabricate an optical shielding layer and uses the same cap layer to form a passivation layer on the contact pad. Preferably, the passivation layer can be used for protecting the contact pad from the damage of developer used during the development process for fabricating color filters, planarizing layer, and microlenses, and the reliability of the contact pad for connecting other devices during wire bonding process is thus significantly increased.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
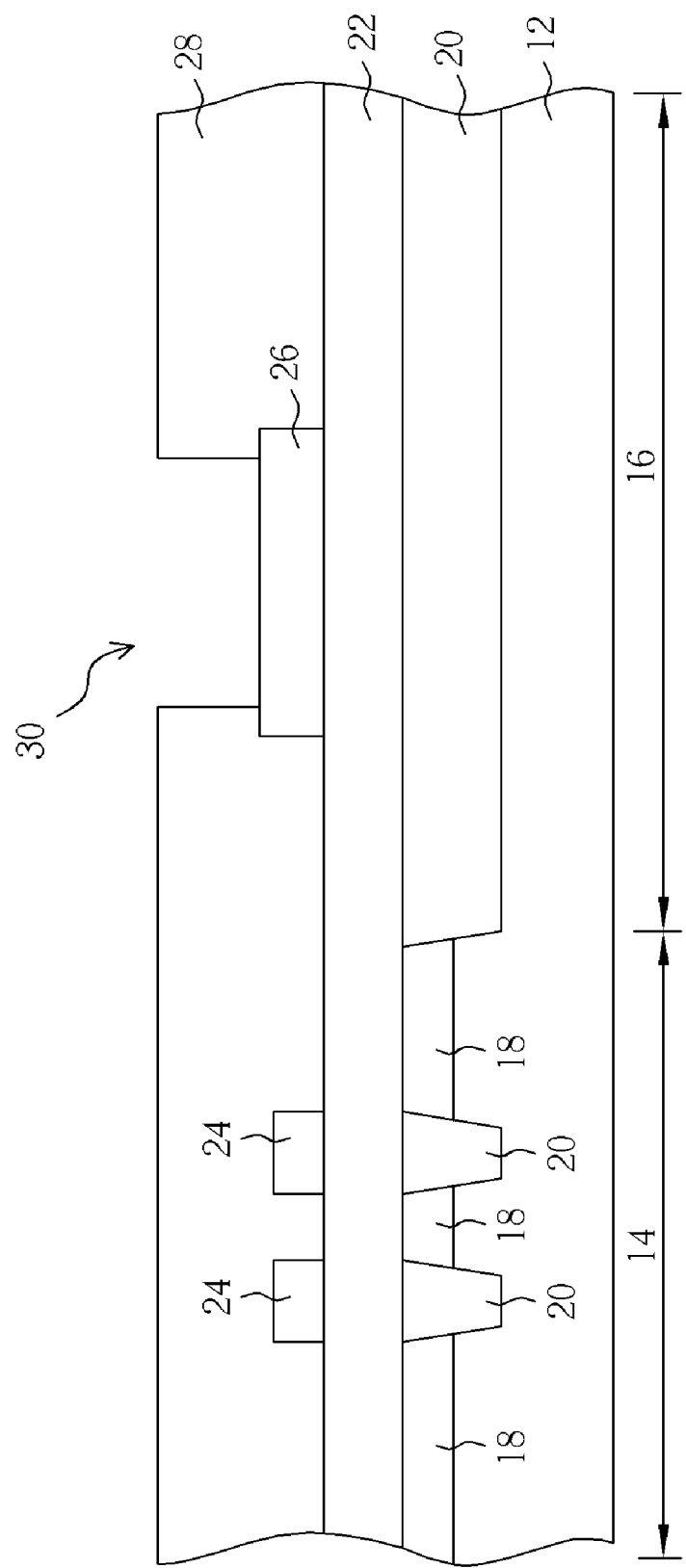
FIGS. 1-4 illustrate a method for fabricating a CMOS image sensor according to the prior art.
Figure 2:
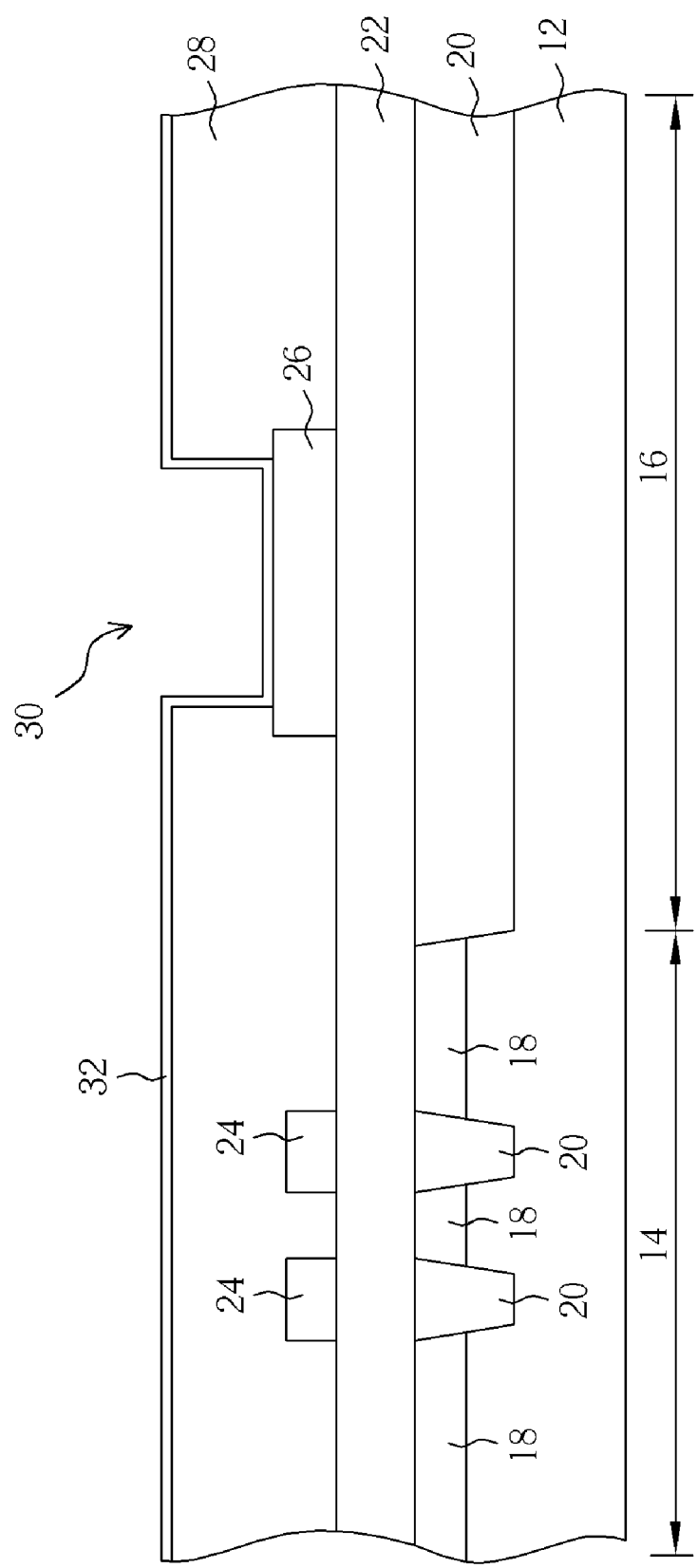
Figure 3:
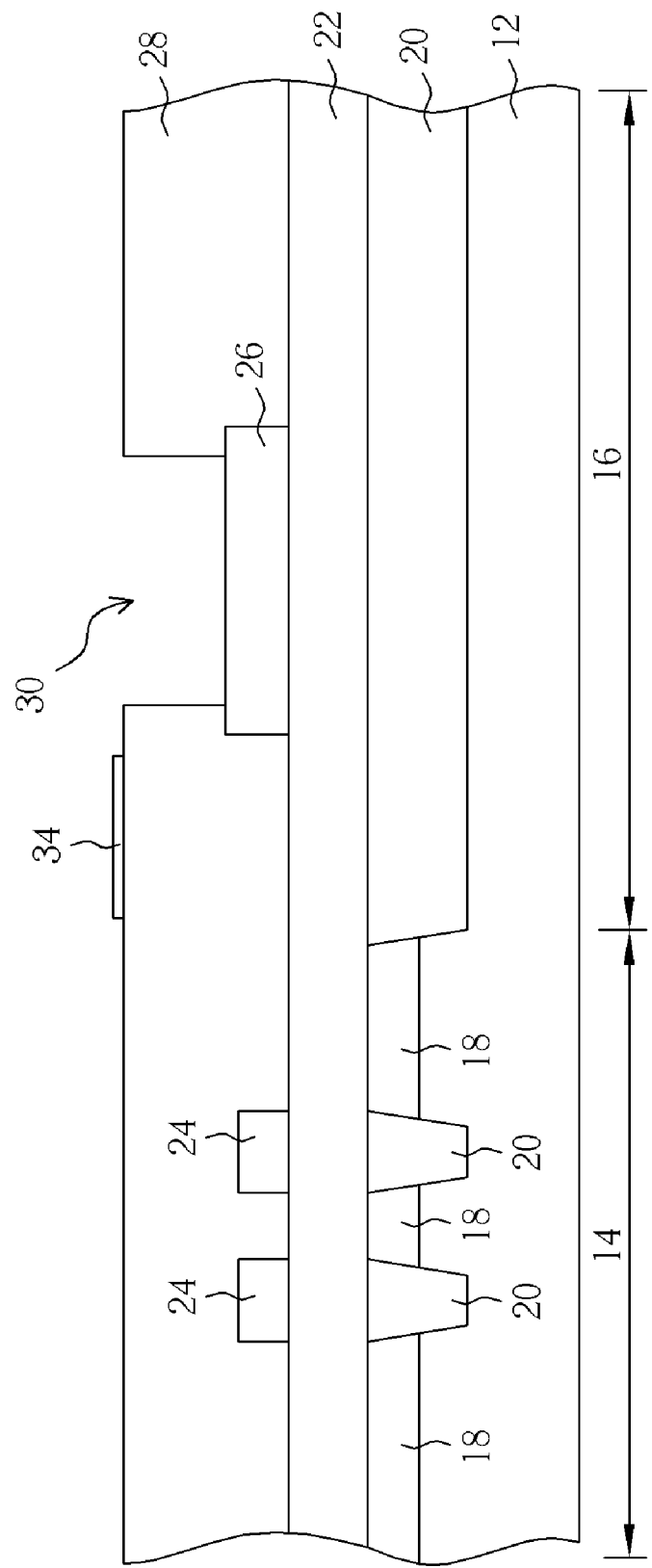
Figure 4:
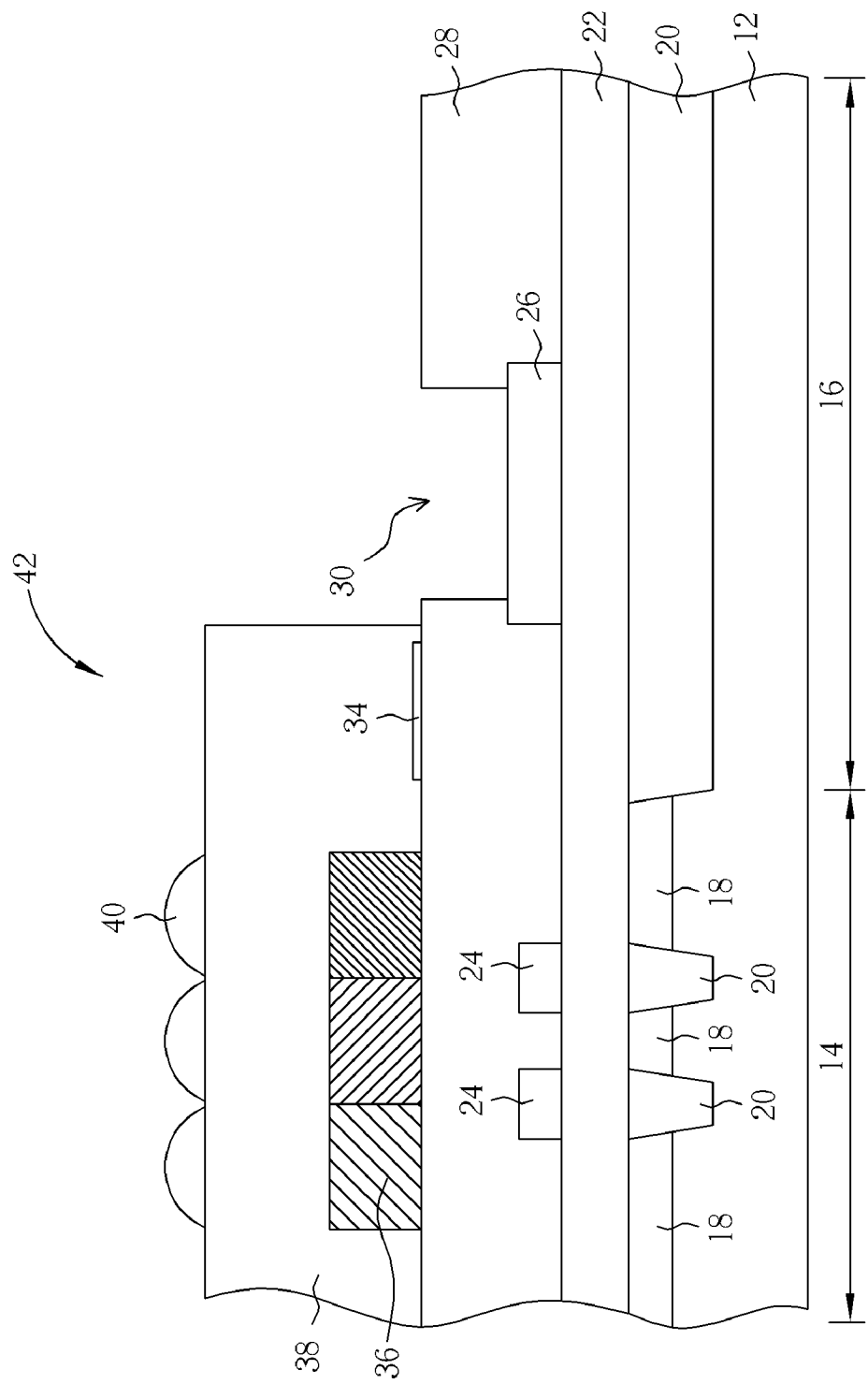
Figure 5:
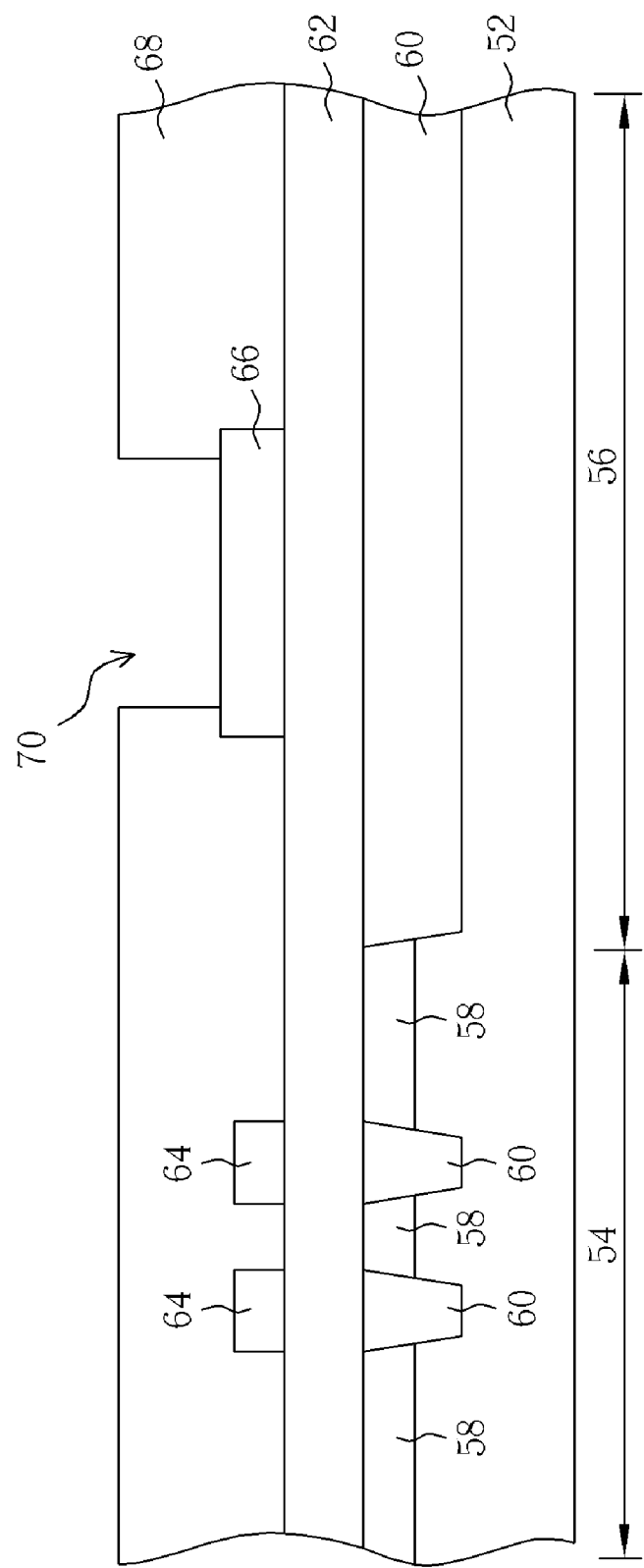
FIGS. 5-10 illustrate a method for fabricating a CMOS image sensor according to a preferred embodiment of the present invention.

Please refer to FIGS. 5-10. FIGS. 5-10 illustrate a method for fabricating a CMOS image sensor according to a preferred embodiment of the present invention. As shown in FIG. 5, a semiconductor substrate 52 having a sensor array region 54 and a peripheral region 56 is provided. A plurality of photodiodes 58, CMOS transistors (not shown), and shallow trench isolations 60 surrounding the photodiodes 58 are formed on the semiconductor substrate 52, and a dielectric layer 62 is deposited on the semiconductor substrate 52 thereafter. Next, a plurality of patterned metal layers 64 is disposed on the dielectric layer 62 of the sensor array region 54 for forming metal interconnects of the CMOS image sensor and a patterned metal layer is disposed on the dielectric layer 62 of the peripheral region 56 for serving as a contact pad 66. Another dielectric layer 68 is disposed on the dielectric layer 62 covering the metal layer 64 and the contact pad 66 thereafter. Next, a patterned photoresist (not shown) is disposed on the dielectric layer 68 and an etching process is performed by using the patterned photoresist as a mask to remove a portion of the dielectric layer 68 for forming an opening 70 in the dielectric layer 68 and exposing the surface of the contact pad 66.

Figure 6:
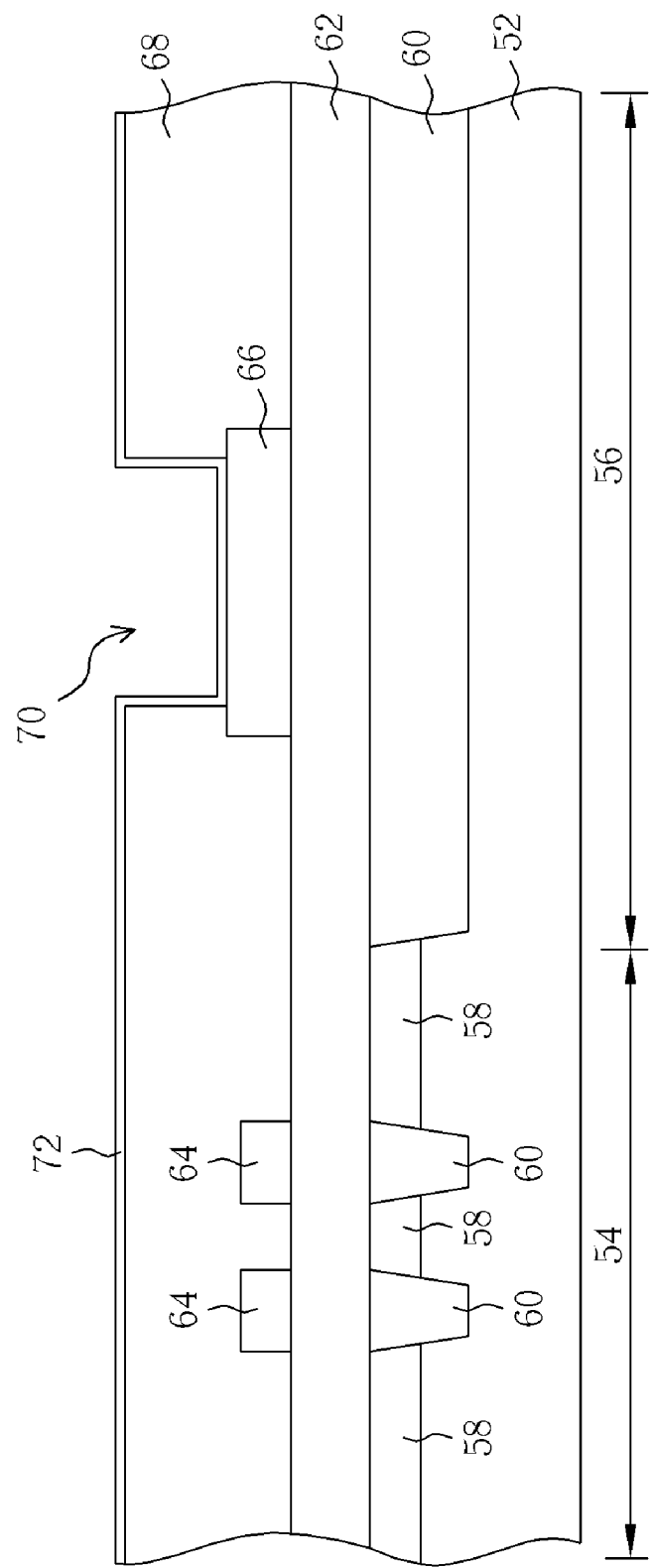

As shown in FIG. 6, a cap layer 72 is disposed on the dielectric layer 68 and the contact pad 66. The cap layer 72 is preferably composed of titanium or titanium nitride. Nevertheless, according to another embodiment of the present invention, the cap layer 72 can also be an oxide layer composed of silicon oxide.

Figure 7:
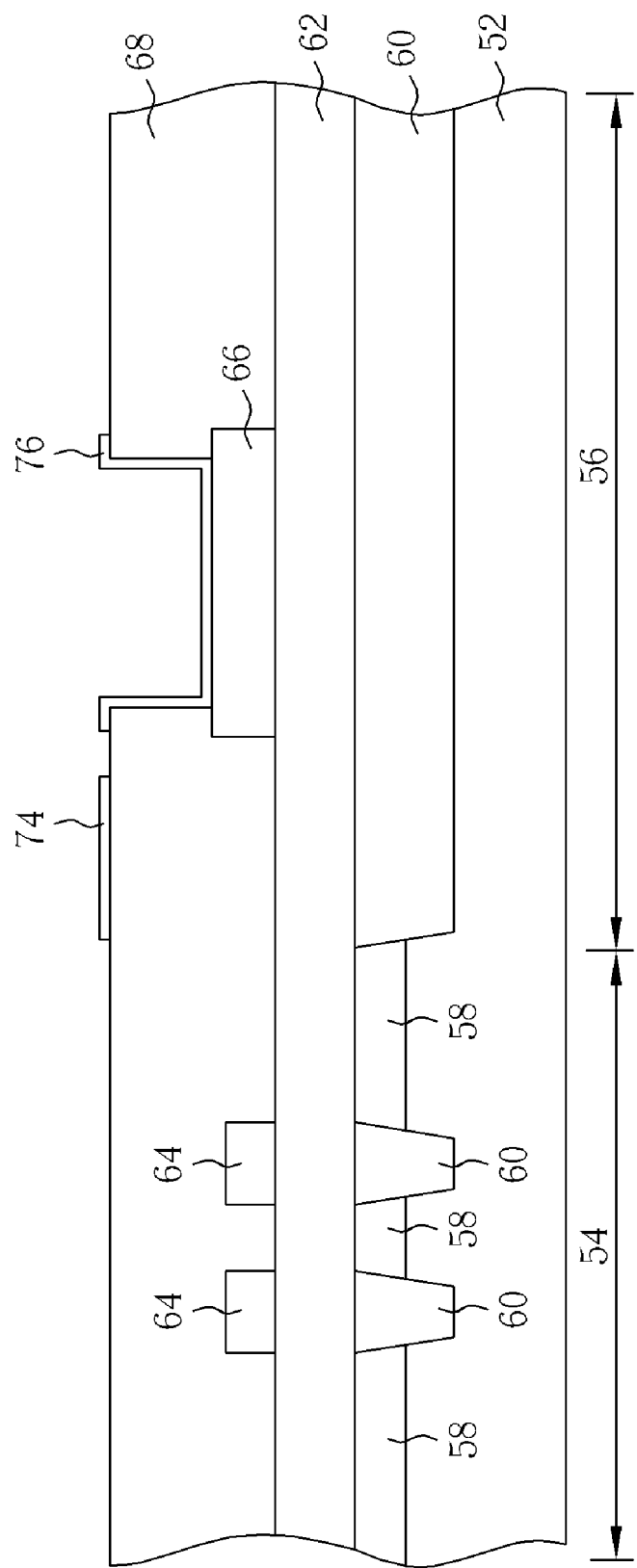

As shown in FIG. 7, a patterned photoresist (not shown) is disposed on the cap layer 72 and an etching process is performed by using the patterned photoresist as a mask to remove a portion of the cap layer 72 for forming an optical shielding layer 74 on the dielectric layer 68 of the peripheral region 56 adjacent to the sensor array region 54 and a passivation layer 76 on the contact pad 66 and within the opening 70 with respect to the dielectric layer 68. The optical shielding layer 74 preferably serves to block external lights projecting from the peripheral region 56 to the sensor array region 54.

It should be noted that the present invention forms an optical shielding layer on the dielectric layer and a passivation layer on the contact pad simultaneously after a pattern transfer process is performed on the cap layer, such that by covering a passivation layer on the contact pad, the surface of the contact pad is not affected by the developer used during the development process and the pitting phenomenon is prevented. Additionally, the region covered by the cap layer 72 can also be adjusted accordingly. For instance, the area of the cap layer 72 can be adjusted by only forming a passivation layer 76 on the contact pad 66 and without forming the optical shielding layer 74 on the sensor array region 54, which are all within the scope of the present invention.

Figure 8:
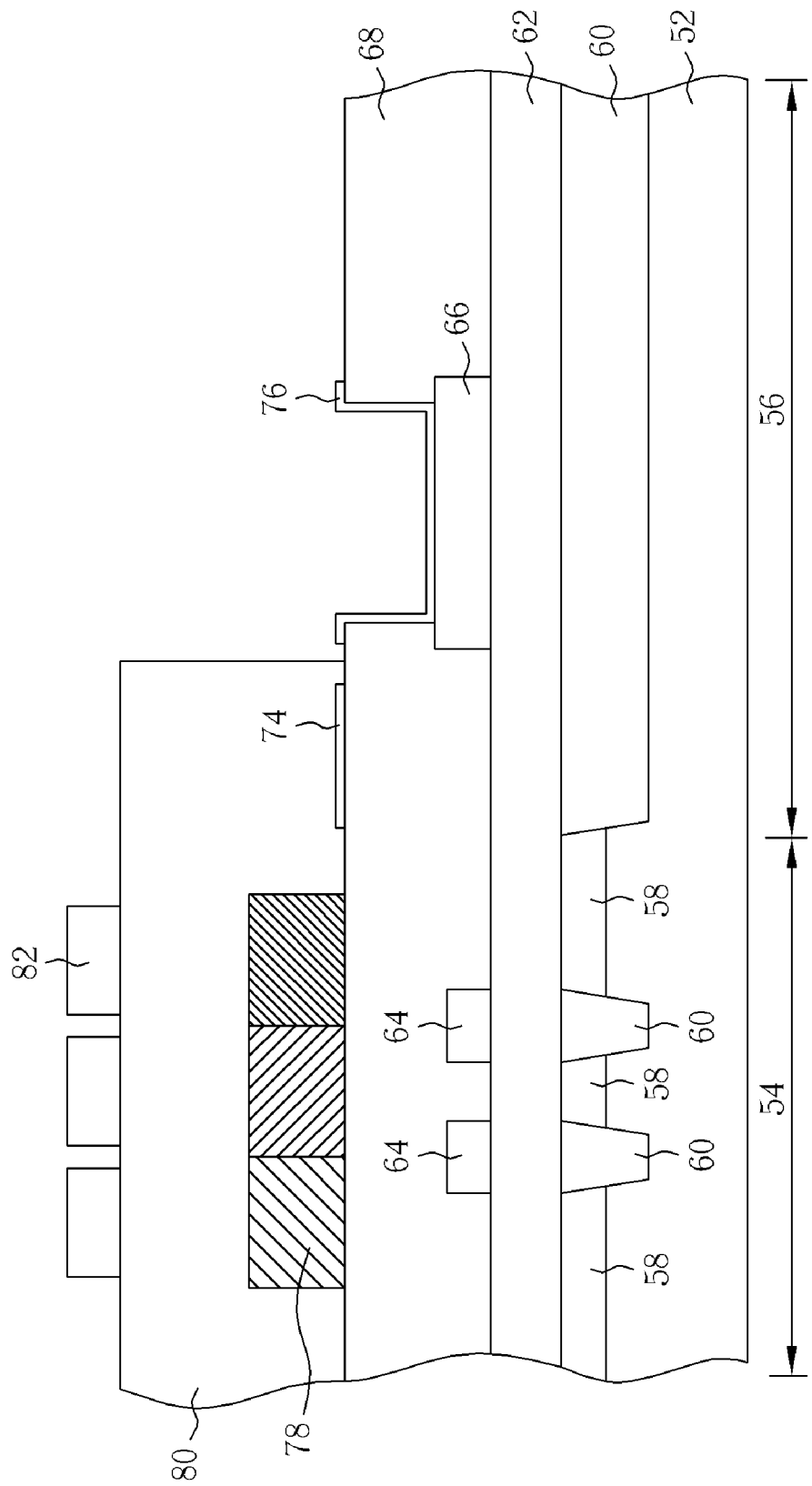

As shown in FIG. 8, a plurality of color filter layers (not shown) is disposed on the dielectric layer 68 of the sensor array region 54, and a series of exposure and development processes are performed to form a plurality of color filters 78 corresponding to each photodiode 58 disposed in the semiconductor substrate 52. The color filters 78 are composed of red color filters, green color filters, blue color filters or filters of other colors. Thereafter, a planarizing layer 80 is formed on the color filters 78 and the optical shielding layer 74, and a polymer layer (not shown) composed of acrylate material is disposed on the planarizing layer 80. Subsequently, a series of exposure and development processes are performed to form a plurality of patterned polymer layers 82 on the planarizing layer 80.

Figure 9:
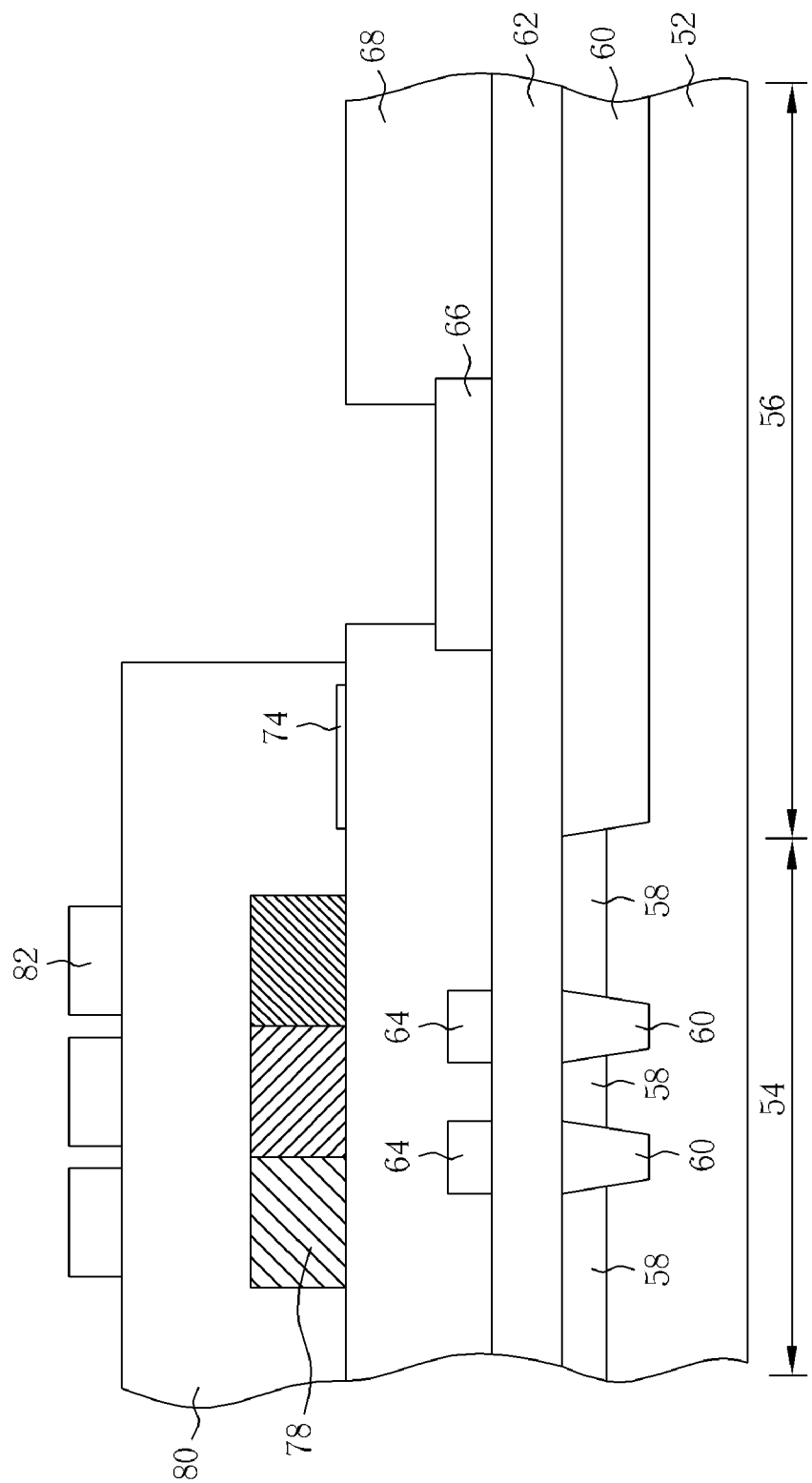

As shown in FIG. 9, the passivation layer 76 disposed on the contact pad 66 is removed. As described above, the cap layer 72 can be composed of titanium or titanium nitride, or can be an oxide layer composed of silicon oxide. If the cap layer 72 is composed of titanium or titanium nitride, a wet etching process can be performed by using ammonium hydrogen peroxide mixture (APM) to remove the passivation layer 76. If the cap layer 72 is an oxide layer composed of silicon oxide, other etchant commonly used in the industry can be used for removing the passivation layer 76. Preferably, the step of removing the passivation layer 76 from the surface of the contact pad 66 can be performed between any two steps conducted after the formation of the color filters 78.

Figure 10:
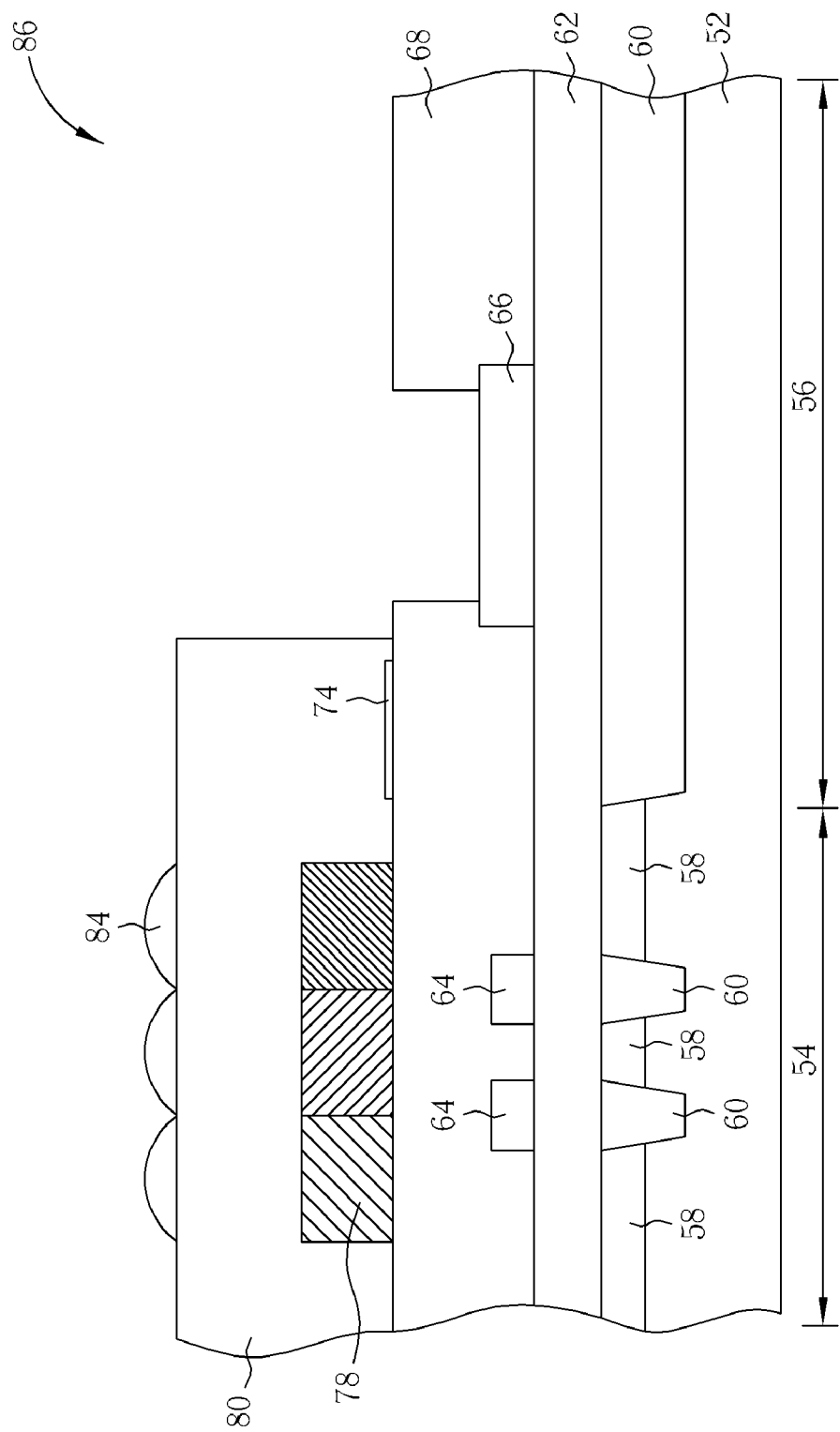

As shown in FIG. 10, a baking process is performed to form a plurality of microlenses 84 on the dielectric layer 68 with respect to the color filters 78, thus complete the fabrication of a CMOS image sensor 86. However, depending on the demand of different fabrication processes, the order for which the passivation layer 76 is removed can be adjusted accordingly. For instance, the fabrication of the microlenses 84 can be completed while the passivation layer 76 is still disposed on the contact pad 66. In this case, a series of exposure, development, and baking process are conducted on the polymer layer, and an etching process is performed thereafter to remove the passivation layer 76 from the surface of the contact pad 66. Alternatively, the passivation layer 76 can be removed as soon as the planarizing layer 80 is formed, which are all within the scope of the present invention.

In contrast to the conventional method for fabricating a CMOS image sensor, the present invention uses a patterned cap layer to fabricate an optical shielding layer and uses the same cap layer to form a passivation layer on the contact pad. Preferably, the passivation layer can be used for protecting the contact pad from the damage of developer used during the development process for fabricating color filters, planarizing layer, and microlenses. Ultimately, the reliability of the contact pad for connecting other devices during wire bonding process is increased significantly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a CMOS image sensor, comprising:

providing a substrate having a sensor array region and a peripheral region;

forming a contact pad on the substrate of the peripheral region;

depositing a dielectric layer on the substrate, wherein the dielectric layer comprises an opening for exposing the surface of the contact pad;

forming a cap layer on the dielectric layer and the contact pad after exposing the surface of the contact pad;

patterning the cap layer for forming an optical shielding layer on the dielectric layer of the peripheral region and a passivation layer on the surface of the exposed contact pad;

forming a plurality of color filters on the dielectric layer of the sensor array region;

forming a planarizing layer on the color filters and the optical shielding layer; and forming a plurality of microlenses on the planarizing layer.

2. The method for fabricating a CMOS image sensor of claim 1 farther comprising removing the passivation layer between any two steps conducted after forming the color filters.

3. The method for fabricating a CMOS image sensor of claim 2, wherein the cap layer, the optical shielding layer, and the passivation layer comprise titanium or titanium nitride.

4. The method for fabricating a CMOS image sensor of claim 3 farther comprising utilizing ammonium hydrogen peroxide (APM) mixture for removing the passivation layer.

5. The method for fabricating a CMOS image sensor of claim 2 farther comprising forming a patterned polymer layer on the planarizing layer.

6. The method for fabricating a CMOS image sensor of claim 5 farther comprising performing a baking process for forming the microlenses on the planarizing layer.

7. The method for fabricating a CMOS image sensor of claim 6 further comprising removing the passivation layer from the surface of the contact pad before performing the baking process.

8. The method for fabricating a CMOS image sensor of claim 6 further comprising removing the passivation layer from the surface of the contact pad after performing the baking process.

9. The method for fabricating a CMOS image sensor of claim 2, wherein the cap layer, the optical shielding layer, and the passivation layer comprise silicon oxide.

10. The method for fabricating a CMOS image sensor of claim 9 further comprising performing a wet etching process for removing the passivation layer.

11. A method for fabricating a CMOS image sensor, comprising:
    providing a substrate having a sensor array region and a peripheral region;
    forming a contact pad on the substrate of the peripheral region;
    depositing a dielectric layer on the substrate, wherein the dielectric layer exposes the surface of the contact pad;
    forming a patterned passivation layer on the contact pad after exposing the surface of the contact pad;
    forming a plurality of color filters on the dielectric layer of the sensor array region;
    forming a planarizing layer on the color filters; and
    forming a plurality of microlenses on the planarizing layer.

12. The method for fabricating a CMOS image sensor of claim 11, wherein the patterned passivation layer comprises titanium or titanium nitride.

13. The method for fabricating a CMOS image sensor of claim 12 further comprising utilizing ammonium hydrogen peroxide (APM) mixture for removing the patterned passivation layer.

14. The method for fabricating a CMOS image sensor of claim 11 further comprising removing the patterned passivation between any two steps conducted after forming the color filters.

15. The method for fabricating a CMOS image sensor of claim 14 further comprising forming a patterned polymer layer on the planarizing layer before forming the microlenses.

16. The method for fabricating a CMOS image sensor of claim 15 further comprising performing a baking process for forming the microlenses on the planarizing layer.

17. The method for fabricating a CMOS image sensor of claim 16 further comprising removing the patterned passivation layer from the surface of the contact pad before performing the baking process.

18. The method for fabricating a CMOS image sensor of claim 14 further comprising removing the patterned passivation layer from the surface of the contact pad after performing the baking process.

19. The method for fabricating a CMOS image sensor of claim 11, wherein the patterned passivation layer comprises silicon oxide.

20. The method for fabricating a CMOS image sensor of claim 19 further comprising performing a wet etching process for removing the patterned passivation layer.

* * * * *